United States Patent
Campbell et al.

(10) Patent No.: US 6,998,719 B2
(45) Date of Patent: Feb. 14, 2006

(54) POWER GRID LAYOUT TECHNIQUES ON INTEGRATED CIRCUITS

(75) Inventors: John Campbell, Los Altos, CA (US); Kim R. Stevens, Auburn, CA (US); Luigi DiGregorio, San Jose, CA (US)

(73) Assignee: Telairity Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/631,471

(22) Filed: Jul. 30, 2003

(65) Prior Publication Data

US 2005/0023705 A1 Feb. 3, 2005

(51) Int. Cl.
*H01L 23/48* (2006.01)

(52) U.S. Cl. .................... 257/786; 257/691; 257/207; 257/208

(58) Field of Classification Search ............... 257/786, 257/691, 207, 208, 773, 698
See application file for complete search history.

(56) References Cited

U.S. PATENT DOCUMENTS

| | | | | |
|---|---|---|---|---|
| 5,498,901 A | * | 3/1996 | Chillara et al. | 257/666 |
| 5,646,548 A | * | 7/1997 | Yao et al. | 326/80 |
| 5,982,632 A | * | 11/1999 | Mosley et al. | 361/775 |
| 6,153,829 A | * | 11/2000 | Carapella et al. | 174/52.1 |

OTHER PUBLICATIONS

Cataldo. A. (2002). "Cadence ratchets up diagonal interconnect effort," EE Times UK, Oct. 6, 2002, 4 pages total.
Glover, R. (2003) "DAC Report 2003, Renewed Optimism in EDA," EDA Today, L.C., Aug. 2003, 7 pages total.
Goering, R. (2003). "ReShape CTO: Time to dump power rings," EEDesign, Mar. 20, 2003, 3 pages total.
Lipman, J. (2001). "X Marks the Spot of New Chip Architecture," TechOnLine, Jun. 13, 2001, 2 pages total.
Silicon Strategies, (2002) "Nikon joins group to validate diagonal IC design," CMP United Business Media, EEdesign website, dated Dec. 10, 2002, 2 pages total.

* cited by examiner

Primary Examiner—Jasmine J. Clark
(74) Attorney, Agent, or Firm—Townsend and Townsend and Crew LLP

(57) ABSTRACT

Techniques are provided for reducing power supply voltage drop introduced by routing conductive traces on an integrated circuit. Techniques for reducing variations in the power supply voltages received in different regions of an integrated circuit are also provided. Power supply voltages are routed within an integrated circuit across conductive traces. The conductive traces are coupled to bond pads that receive power supply voltages from an external source. Alternate ones of the traces receive a high power supply voltage $V_{DD}$ and a low power supply voltage $V_{SS}$. The conductive traces reduce the voltage drop in the power supply voltages by providing shorter paths to route the power supply voltages to circuit elements on the integrated circuit.

20 Claims, 4 Drawing Sheets

POWER GRID LAYOUT TECHNIQUES ON INTEGRATED CIRCUITS

BACKGROUND OF THE INVENTION

1. Field of the Invention

The present invention relates to techniques for laying out power grids on integrated circuits, and more particularly, to techniques for routing supply voltage traces on integrated circuits that have a low voltage drop.

Power supply voltages are typically supplied to an integrated circuit from an external power supply source. The power supply voltages connect to the integrated circuit through bond pads on the integrated circuit. The power supply voltages are routed from the bond pads to transistors on the integrated circuit through metal traces formed in one or more metal layers.

Typically ring structures at the edges of the integrated circuit form the backbone of the power distribution system. The metal traces extend from the ring structures to the center of the integrated circuit in a serpentine fashion. The metal traces are then coupled to transistors in other layers of the integrated circuit. The traces used to route supply voltages to transistors at the center of an integrated circuit are substantially longer than the traces used to route the supply voltages to transistors near the edge of the integrated circuit.

The metal traces used to route power supply voltages into an integrated circuit have resistance. Because longer metal traces are used to route supply voltages and current to transistors that are farther away from the bond pads, transistors at the center of the integrated circuit receive a reduced supply voltage ($V_{DD}$–$V_{SS}$) relative to the supply voltage received by transistors near an edge of the integrated circuit. The magnitude of the voltage drop depends on the amount of current demanded as well as the size and the resistance of the conductors.

The speed of transistors is dependent in part on the magnitude of the power supply voltages they receive. Devices at the center of an integrated circuit may operate at reduced speeds, because they receive a reduced supply voltage. This can cause timing problems such as clock skew or increased propagation delay of gates and flip-flops. In larger integrated circuits, the reduction in the supply voltage can be even larger at the center of the chip.

Therefore, it would be desirable to provide techniques for routing power supply voltages within an integrated circuit that reduces voltage drop in the routing traces. It would also be desirable to provide techniques for routing power supply voltages within an integrated circuit that reduces the variations in the power supply voltages received in different regions of the integrated circuit.

BRIEF SUMMARY OF THE INVENTION

The present invention provides techniques for reducing voltage drops in power supply traces on an integrated circuit. The present invention also provides techniques for reducing variations in the power supply voltages received in different regions of an integrated circuit.

According to the present invention, power supply voltages are routed through traces in a conducting layer of an integrated circuit. The power supply voltages are provided to the traces from external voltage sources through bond pads. Circuit elements in other layers of the integrated circuit are coupled to the traces to receive the power supply voltages.

A first set of traces in the conducting layer receives a high power supply voltage $V_{DD}$. A second set of traces in the conducting layer receives a low power supply voltage $V_{SS}$. The first and second sets of traces can be parallel traces that are routed from one edge of the integrated circuit to another edge. The $V_{DD}$ and $V_{SS}$ traces are interleaved together.

Power supply traces of the present invention provide more direct and more uniform paths to route power supply voltages to circuit elements on an integrated circuit. Additional cross grids of underlying metal layers can be provided to strengthen the power supply traces.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
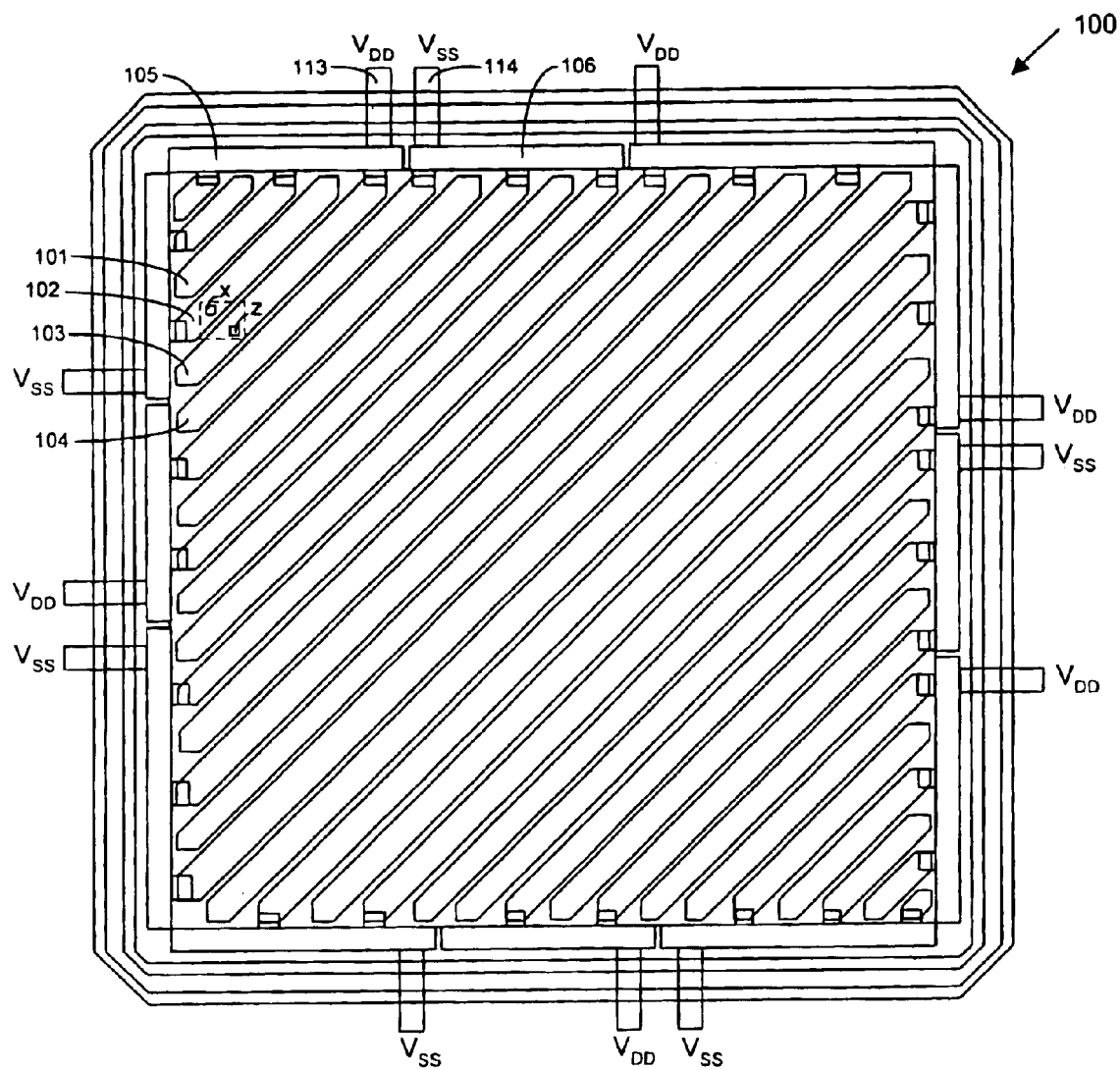
FIG. 1 illustrates a diagram of a first embodiment of a power grid layout with diagonal power supply traces according to the principles of the present invention.

FIG. 1 illustrates a first embodiment of the present invention. Integrated circuit 100 includes a plurality of conductive traces such as traces 101–104. The conductive traces are formed in a conductive layer of integrated circuit 100. The conductive traces are aligned diagonally with respect to an edge of circuit 100 as shown in FIG. 1. In one example embodiment of the present invention, the conductive traces are routed at 45 degree angles with respect to the edges of circuit 100. As another example, the conductive traces are routed at an angle between 35 and 55 degrees with respect to an edge of circuit 100.

The diagonal traces are parallel to each other. The diagonal traces can be, for example, several hundred microns in width down to the design rule limits of a particular process technology. As process technology advances, an additional advantage can be obtained by selecting a width for the traces that is at or near the design rule limits. For a given area, the amount of sidewall capacitance between $V_{DD}$ and $V_{SS}$ increases near the design rule limits and is effectively additional power supply bypass capacitance. This also increases the effective resistance of the $V_{DD}$ and $V_{SS}$ traces shown in FIG. 1.

In the embodiment of FIG. 1, the diagonal traces are slanted upwardly from the bottom left to the upper right corners of circuit 100. According to other embodiments of the present invention, the diagonal traces are slanted the other way, downwardly from top left to lower right corners of an integrated circuit.

Integrated circuit 100 includes a plurality of bond pads such as bond pads 113 and 114. Each bond pad is coupled to a power supply voltage source. For example, bond pad 113 is coupled to high power supply voltage source $V_{DD}$, and bond pad 114 is coupled to low power supply voltage source $V_{SS}$.

Bus bars (e.g., 105 and 106) are conductive regions that are located along each of the four edges of circuit 100. There are three bus bars along each edge of integrated circuit 100. This number is used merely as an example and is not intended to limit the scope of the present invention. Any suitable number of bus bars can be located along each edge of an integrated circuit. For example, there can be 10 bus bars along each edge of the circuit.

Each of the bond pads is coupled to a bus bar. For example, bond pad 113 is coupled to bus bar 105, and bond pad 114 is coupled to bus bar 106. In FIG. 1, each of the bus bars is coupled to one bond pad. In further embodiments of the present invention, each bus bar is coupled to two, three, four, five, six, seven, eight, nine, ten, or more bond pads.

Each of the diagonal traces is coupled to one of the bus bars. For example, conductive traces 101 and 103 are coupled to bus bar 105. Therefore, conductive traces 101 and 103 are powered to supply voltage $V_{DD}$ through bond pad 113. Conductive trace 104 is coupled to bus bar 106. Therefore, conductive trace 104 is powered to supply voltage $V_{SS}$ through bond pad 114.

The conductive traces such as 101 and 103 that are powered by $V_{DD}$ are referred to as the $V_{DD}$ traces. The conductive traces such as 102 and 104 that are powered by $V_{SS}$ are referred to as the $V_{SS}$ traces. The $V_{DD}$ traces are interleaved between the $V_{SS}$ traces as shown in FIG. 1. Each $V_{DD}$ trace is in between two $V_{SS}$ traces, and each $V_{SS}$ trace is in between two $V_{DD}$ traces, except the traces in the upper left and the lower right of circuit 100. Thus, circuit 100 has a power grid that comprises conductive traces that are alternately coupled to $V_{DD}$ and to $V_{SS}$ in a comb structure. The comb structure allows the $V_{DD}$ and $V_{SS}$ traces to be closely spaced to allow more connections from the $V_{DD}$ and $V_{SS}$ traces to the underlying layers of integrated circuit 100.

The number of $V_{DD}$ and $V_{SS}$ traces, bond pads, and bus bars shown in FIG. 1 and the other figures are merely examples of the present invention that are used for illustrative purposes. Integrated circuits of the present invention can have any number of $V_{DD}$ and $V_{SS}$ traces, bus bars, and bond pads.

Figure 2:
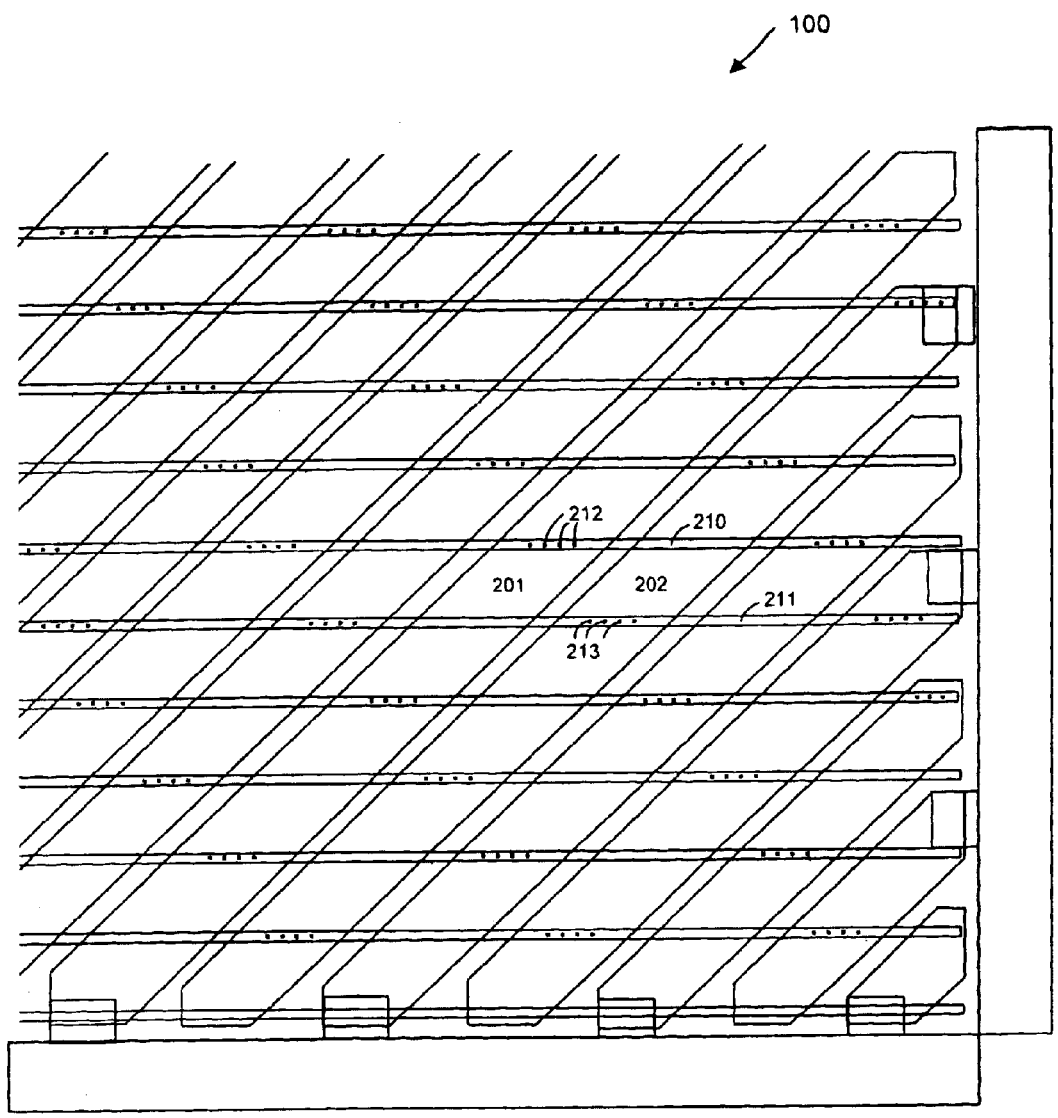
FIG. 2 illustrates a diagram of a second embodiment of a power grid layout with wires in a second conductive layer according to the principles of the present invention.

According to an embodiment of the present invention, the $V_{DD}$ and $V_{SS}$ traces are connected to wires in a second conductive layer of an integrated circuit, e.g., through vias. FIG. 2 illustrates an example of this embodiment of the present invention. FIG. 2 illustrates further details of integrated circuit 100. According to this embodiment, $V_{DD}$ and $V_{SS}$ traces are formed in a first conductive layer of integrated circuit 100, and horizontal wires are formed in a second conductive layer of circuit 100.

Wires 210–211 are examples of horizontal wires in the second conductive layer. Wire 210 is coupled to $V_{DD}$ trace 201 through vias 212. Wire 210 is also coupled to other $V_{DD}$ traces on circuit 100 through other sets of vias as shown in FIG. 2. Wire 211 is coupled to $V_{SS}$ trace 202 through vias 213. Wire 211 is also coupled to other $V_{SS}$ traces on circuit 100 through other sets of vias as shown in FIG. 2.

A power pole begins at a third layer on integrated circuit 100. The third layer may be, for example, below the first and second layers. The power pole delivers the power supply voltages to additional layers in circuit 100. For example, the power pole can deliver the power supply voltages to transistors in lower layers of circuit 100.

Connections can be made from the $V_{DD}$ and $V_{SS}$ traces to underlying layers at regular intervals. For example, connections can be made from the $V_{DD}$ and $V_{SS}$ traces to underlying layers every 25–50 microns across chip 100. Alternatively, connections can be made at irregular intervals. The distance between intervals can vary depending upon the process technology and transistor dimensions. For example, connections can be made at smaller intervals in finer processes.

The design of numerous interleaved $V_{DD}$ and $V_{SS}$ traces across a power layer as shown in FIG. 1 allows the power supply voltages to be connected more directly to circuit elements in other layers of chip 100 (such as transistors). Because the $V_{DD}$ and $V_{SS}$ traces are interleaved together across the length of chip 100, circuit elements that lie anywhere on chip 100 are close to the nearest $V_{DD}$ and $V_{SS}$ traces.

Each circuit element in chip 100 is close to the nearest $V_{DD}$ connection via a $V_{DD}$ trace. Each circuit element in chip 100 is close to the nearest $V_{SS}$ connection via a $V_{SS}$ trace. For example, assume that the horizontal wires such as wires 210 and 211 in the second conductive layer are spaced a distance X microns apart from each other, and that the horizontal wires traverse the entire area of chip 100. Any circuit element on chip 100 is no more than X microns from a connection to $V_{DD}$ or $V_{SS}$ through one of the horizontal wires in the second conductive layer.

As another example, circuit elements in underlying layers of circuit 100 can connected directly to the diagonal $V_{DD}$ and $V_{SS}$ traces (e.g., traces 101–104 of FIG. 1), without excessive routing through a second conductive layer. According to the present invention, the length of routes needed to connect a power supply source to a circuit element in chip 100 is reduced, because the power supply routes through the $V_{DD}$ and $V_{SS}$ traces are shorter and more direct than prior art power supply routing techniques.

Prior art techniques used longer wires routed in irregular patterns to transmit power supply voltages to the circuit elements. The wires that brought power supplies to circuit elements at the center of a chip are especially long and resistive in prior art systems. The present invention reduces the length of wire between the bond pads and the endpoint circuit elements that receive the power supply.

In general, the total resistance in a conductor increases proportionally with the length of the conductor. Because the length of the conductors used to route power supply voltages is reduced in the present invention, these conductors cause less of a voltage drop in the power supply voltages $V_{DD}$ and $V_{SS}$. By reducing voltage drops in the power supply that are caused by the resistance of routing wires, circuit elements in chip 100 can operate at a faster and more uniform speed.

The voltage drop in the power supply voltage across one of the $V_{DD}$ or the $V_{SS}$ traces is based on the resistance between the bond pad and the connection to a circuit element. For example, in FIG. 1, a circuit element in an underlying layer is shown by the dotted line. This circuit element is coupled to $V_{SS}$ trace 102 through via X, and to $V_{DD}$ trace 103 through via Z. The voltage drop between $V_{DD}$ and $V_{SS}$ is reduced by the resistance in a large percentage of the length of trace 103 and the resistance in a small percentage of the length of trace 102.

A small voltage drop in $V_{SS}$ introduced by trace 102 compensates for a larger voltage drop in $V_{DD}$ introduced by trace 103. Conversely, in a circuit element located adjacent to bond pad 105, a small voltage drop in $V_{DD}$ compensates for a larger voltage drop in $V_{SS}$. Because of this compensating effect, the total voltage difference between $V_{DD}$ and $V_{SS}$ is about the same regardless of where along the length of the $V_{DD}$ and $V_{SS}$ traces the connections to other layers are made.

By providing a more uniform voltage difference between $V_{DD}$ and $V_{SS}$ across the area of circuit 100, the speed of underlying circuit elements is more predictable and more uniform across the area of the chip. Because the voltage difference between $V_{DD}$ and $V_{SS}$ is nearly the same everywhere on chip 100, clock skew caused by variations in the power supply voltages is substantially reduced.

Thus, the techniques of the present invention provide consistency in terms of circuit elements located in different areas of chip 100. In prior art systems, there can be large variations in the length of wires that connect the supply voltages to different parts of the chip. As a result, supply voltages have different voltage drops in different portions of a chip. Transistors that receive a greater supply voltage operate faster than transistors that receive a smaller supply voltage.

According to the present invention, supply voltages provided to different portions of chip 100 have a more uniform voltage drop. By providing alternating traces coupled to $V_{DD}$ and $V_{SS}$, each circuit element is relatively close to a power supply connection. This design provides more uniform power supply voltages across the chip.

As a result, variations in the speed of circuit elements in different areas of chip 100 are reduced. Reducing variations in the speed of circuit elements is especially important for clock buffers in circuit designs that require balanced clock trees as an important part of the circuit design.

The present invention also increases the power supply voltage different between $V_{DD}$ and $V_{SS}$ received by circuit elements on chip 100. The $V_{DD}$ traces of the present invention cause less of a voltage drop in $V_{DD}$, and the $V_{SS}$ traces of the present invention cause less of a voltage drop in $V_{SS}$. The result is that the total supply voltage $V_{DD}$-$V_{SS}$ is greater.

For example, $V_{DD}$ and $V_{SS}$ traces of the present invention can add less than 10 mV of voltage drop into $V_{DD}$ or $V_{SS}$. In this example, the total voltage drop from $V_{DD}$ to $V_{SS}$ is reduced to less than 20 mV from its ideal value due to resistance in the interconnecting wires. As a more specific example, a 3 volt ideal value for $V_{DD}$ is reduced to 2.99 volts by the connecting wires, and a 0 volt ideal value for $V_{SS}$ is increased to 0.01 volts by the connecting wires, for a total supply voltage drop of 2.98 volts.

The connecting wires in many prior art chips add more than 200 mV of voltage into $V_{DD}$ and $V_{SS}$. 200 mV represents 11% of a 1.8 volt upper supply voltage $V_{DD}$. 200 mV represents 20% of a 1.0 volt upper supply voltage $V_{DD}$. Thus, as supply voltages are reduced, the voltage drop added by the connecting wires represents an increasingly significant portion of the total supply voltage. The present invention provides a cost efficient solution for reducing the voltage drops that are added by connecting wires to the supply voltage.

By reducing the supply voltage drop caused by connecting wires, circuit elements in a chip have improved performance characteristics. For example, transistors can operate faster with a larger voltage differential between $V_{DD}$ and $V_{SS}$. In addition, computer aided design (CAD) tools can more accurately predict the performance of circuit elements when the supply voltage drops caused by connecting wires are reduced.

The embodiment of FIG. 1 also has improved characteristics regarding driving large bus structures, because the power rails do not collapse while driving many parallel long wires from a set of 16/32/64/128 buffers driving from approximately the same location.

Figure 3:
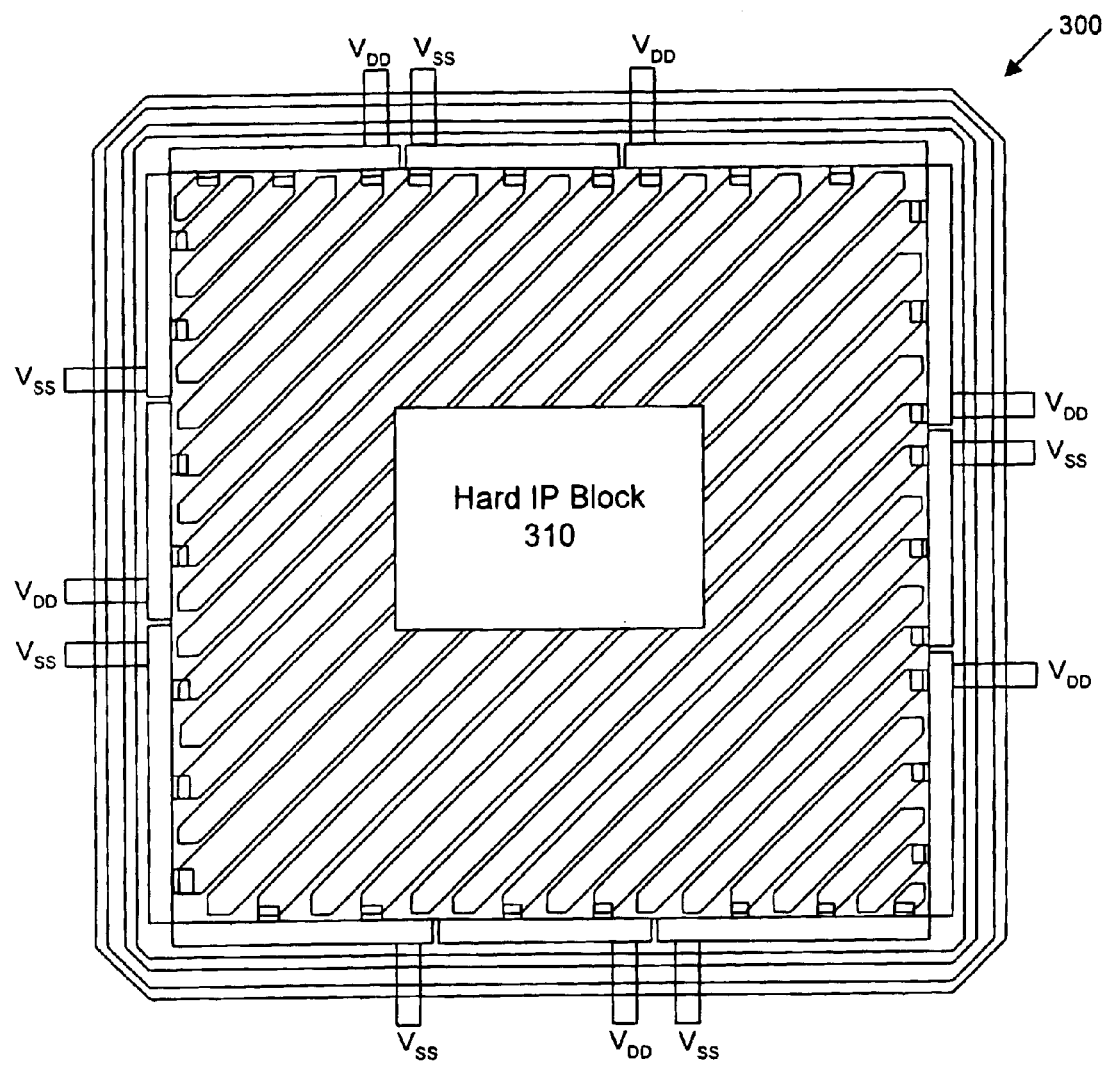
FIG. 3 illustrates a diagram of a third embodiment of a power grid layout with a hard IP block according to the principles of the present invention.

FIG. 3 illustrates a further embodiment of the present invention. Integrated circuit 300 shown in FIG. 3 includes diagonal traces that are alternately coupled to $V_{DD}$ and $V_{SS}$ as discussed in the embodiments above. Integrated circuit 300 also includes a hard intellectual (IP) property block 310. Hard IP 310 can comprise any circuit design. Hard IP block includes a portion of the power supply layer. Therefore, the $V_{DD}$ and $V_{SS}$ traces of the present invention cannot overlay hard IP block 310. The $V_{DD}$ and $V_{SS}$ traces provide supply voltages to everywhere on chip 300 except to IP block 310. However, the point of FIG. 3 is to show that the present invention can include a power supply layer with holes in it that are used by a hard IP block with connections made to the IP block from the power grid of the present invention. In some cases, the power grid can cover and connect to the hard IP block in the same fashion of as with the present invention.

Figure 4:
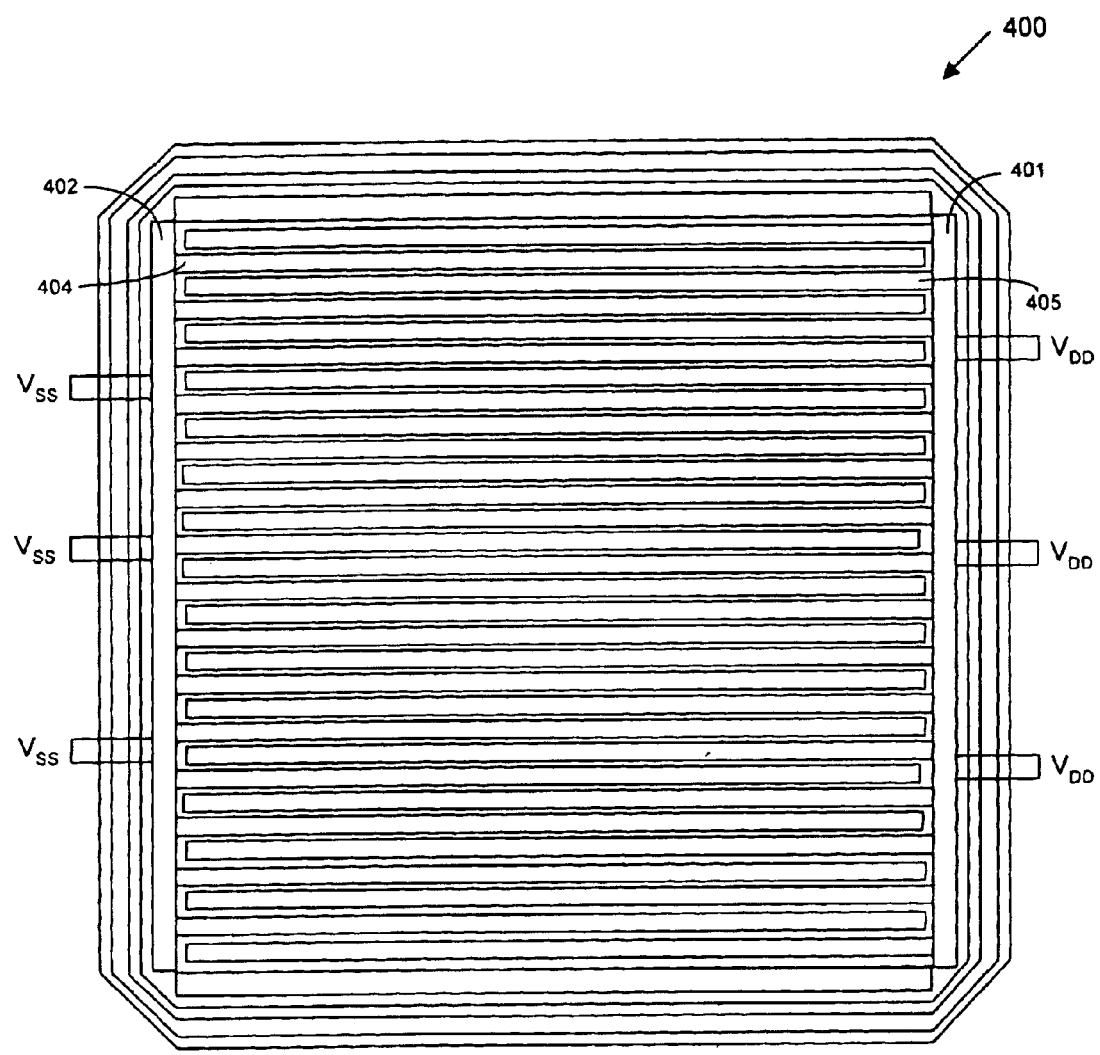
FIG. 4 illustrates a diagram of a fourth embodiment of a power grid layout with horizontal power supply traces according to the principles of the present invention.

FIG. 4 illustrates yet another embodiment of the present invention. Integrated circuit 400 shown in FIG. 4 includes several horizontal $V_{DD}$ and $V_{SS}$ power supply traces such as traces 404 and 405. The horizontal power supply traces are formed in a conductive layer such as metal. Each of the horizontal traces is coupled to one of bus bars 401 or 402 on the edges of circuit 400. Bus bar 401 is coupled to the upper supply voltage $V_{DD}$ through three bond pads, and bus bar 402 is coupled to the lower supply voltage $V_{SS}$ through three bond pads.

The $V_{SS}$ traces, including trace 404, are coupled to bus bar 402. The $V_{DD}$ traces, including trace 405, are coupled to bus bar 401. The horizontal traces of circuit 400 form an interleaved combed structure of $V_{DD}$ and $V_{SS}$ traces.

Circuit elements in other layers of chip 400 can connect to the horizontal $V_{DD}$ and $V_{SS}$ traces. The connections to the $V_{DD}$ and $V_{SS}$ traces can be made at any point along the length of the traces. The connections can be made via a second conductive layer that is perpendicular to the $V_{DD}$ and $V_{SS}$ traces.

Circuit 400 provides a more uniform power supply voltage to circuit elements in other layers of the chip, because each of the $V_{DD}$ and $V_{SS}$ traces are the same length. Therefore, the voltage drop removed from the power supply by the $V_{DD}$ and $V_{SS}$ traces is about the same everywhere on circuit 400. Also, the voltages in the $V_{DD}$ and $V_{SS}$ traces compensate as described above. FIG. 4 shows horizontal connection to the bus bars. The present invention also includes vertical power supply traces and connections.

The present invention provides techniques for routing power supply voltages into an integrated circuit along routing traces (conductors). The present invention reduces the voltage drop introduced by the routing wires into the supply voltage by providing interleaved traces across the circuit, as discussed above. Circuit elements that receive larger power supply voltages usually operate at faster speeds.

The present invention reduces the differential between supply voltages provided to the edge of a chip and supply voltages provided to the center of the chip. This reduces variations in the speed of circuit elements in different areas of a chip. It is especially important that more uniform power supply voltages be provided in large area chips, chips that consume a large amount of power, chips that have wires with finer geometries (i.e., larger routing resistances), and chips that have more congested routing layers.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. An integrated circuit comprising:
   first bond pads coupled to receive a first power supply voltage;
   second bond pads coupled to receive a second power supply voltage;
   first traces formed in a first conductive layer and coupled to receive the first power supply voltage; and
   second traces formed in the first conductive layer and coupled to receive the second power supply voltage,
   wherein the first traces are interleaved in between the second traces such that at least one of the first traces lies in between two of the second traces, and at least one of the second traces lies in between two of the first traces.

2. The integrated circuit of claim 1 wherein the integrated circuit has a hard intellectual property block that does not include the first and the second traces.

3. The integrated circuit of claim 1 wherein the integrated circuit has a hard intellectual property (HIP) block, and portions of the first and the second traces cover the HIP block.

4. The integrated circuit of claim 1 wherein the first and the second traces are routed at an angle between 35–55 degrees with respect to an edge of the integrated circuit.

5. The integrated circuit of claim 1 wherein the first and the second traces cross an entire width of the integrated circuit.

6. The integrated circuit of claim 1 wherein the first and the second traces are parallel to each other.

7. An integrated circuit comprising:
   first bond pads coupled to receive a first power supply voltage;
   second bond pads coupled to receive a second power supply voltage;
   first traces formed in a first conductive layer and coupled to receive the first power supply voltage; and
   second traces formed in the first conductive layer and coupled to receive the second power supply voltage,
   wherein the first traces are interleaved in between the second traces, and the first and the second traces are routed through the first conductive layer diagonally with respect to an edge of the integrated circuit.

8. The integrated circuit of claim 7 wherein the first and the second traces are parallel to each other.

9. An integrated circuit comprising:
   first bond pads coupled to receive a first power supply voltage;
   second bond pads coupled to receive a second power supply voltage;
   first traces formed in a first conductive layer and coupled to receive the first power supply voltage; and
   second traces formed in the first conductive layer and coupled to receive the second power supply voltage,
   wherein the first traces are interleaved in between the second traces, and each of the first and the second traces are coupled to one of a plurality of bus bars that are located along edges of the integrated circuit.

10. The integrated circuit of claim 9 wherein:
    at least three of the bus bars are located on each edge of the integrated circuit.

11. The integrated circuit of claim 9 wherein each of a first subset of the bus bars is coupled to at least one of the first bond pads, and each of a second subset of the bus bars is coupled to at least one of the second bond pads.

12. The integrated circuit of claim 11 wherein each of the first subset of the bus bars is coupled to at least two of the first bond pads, and each of the second subset of the bus bars is coupled to at least two of the second bond pads.

13. An integrated circuit comprising:
    first bond pads coupled to receive a first power supply voltage;
    second bond pads coupled to receive a second power supply voltage;
    first traces formed in a first conductive layer and coupled to receive the first power supply voltage; and
    second traces formed in the first conductive layer and coupled to receive the second power supply voltage,
    wherein the first traces are interleaved in between the second traces, and the first and the second traces are routed through the first conductive layer horizontally with respect to two edges of the integrated circuit.

14. An integrated circuit comprising:
    first bond pads coupled to receive a first power supply voltage;
    second bond pads coupled to receive a second power supply voltage;
    first traces formed in a first conductive layer and coupled to receive the first power supply voltage; and
    second traces formed in the first conductive layer and coupled to receive the second power supply voltage,
    wherein the first traces are interleaved in between the second traces, and the first and the second traces are routed through the first conductive layer vertically with respect to the two edges of the integrated circuit.

15. An integrated circuit comprising:
    first bond pads coupled to receive a first power supply voltage;
    second bond pads coupled to receive a second power supply voltage;
    first traces formed in a first conductive layer and coupled to receive the first power supply voltage;
    second traces formed in the first conductive layer and coupled to receive the second power supply voltage, wherein the first traces are interleaved in between the second traces; and
    routing conductors formed in a second conductive layer of the integrated circuit that are coupled to the first and the second traces through vias.

16. The integrated circuit of claim 15 wherein:
    circuit elements in a third layer of the integrated circuit are coupled to receive the first and the second power supply voltages through the routing conductors, the first traces, and the second traces.

17. The integrated circuit of claim 15 wherein the first and the second traces are routed through the first conductive layer diagonally with respect to an edge of the integrated circuit.

18. The integrated circuit of claim 15 wherein the first and the second traces are routed through the first conductive layer vertically or horizontally with respect to an edge of the integrated circuit.

19. An integrated circuit comprising:
    first bond pads coupled to receive a first power supply voltage;
    second bond pads coupled to receive a second power supply voltage;
    first traces formed in a first conductive layer and coupled to receive the first power supply voltage; and
    second traces formed in the first conductive layer and coupled to receive the second power supply voltage, wherein the first conductive layer includes a hard intellectual property block that does include the first or the second traces, and the first traces are interleaved in between the second traces.

20. An integrated circuit comprising:

first bond pads coupled to receive a first power supply voltage;

second bond pads coupled to receive a second lower supply voltage;

first traces formed in a first conductive layer and coupled to receive the first power supply voltage; and second traces formed in the first conductive layer and coupled to receive the second power supply voltage, wherein the first and the second traces are routed at a 45 degree angle with respect to edges of the integrated circuit, and the first traces are interleaved in between the second traces.

* * * * *